(12) United States Patent
Chen et al.

(10) Patent No.: US 9,355,821 B2
(45) Date of Patent: May 31, 2016

(54) LARGE-AREA PLASMA GENERATING APPARATUS

(71) Applicant: INSTITUTE OF NUCLEAR ENERGY RESEARCH ATOMIC ENERGY COUNCIL, EXECUTIVE YUAN, Taoyuan County (TW)

(72) Inventors: Hsin-Liang Chen, Pingtung County (TW); Cheng-Chang Hsieh, Chiayi (TW); Deng-Lain Lin, Taoyuan County (TW); Yan-Zheng Du, Taoyuan County (TW); Chi-Fong Ai, Taoyuan County (TW); Ming-Chung Yang, Taoyuan County (TW)

(73) Assignee: INSTITUTE OF NUCLEAR ENERGY RESEARCH ATOMIC ENERGY COUNCIL, EXECUTIVE YUAN, Taoyuan County (TW)

( * ) Notice: Subject to any disclaimer, the term of this patent is extended or adjusted under 35 U.S.C. 154(b) by 176 days.

(21) Appl. No.: 13/921,301

(22) Filed: Jun. 19, 2013

(65) Prior Publication Data

US 2014/0375207 A1    Dec. 25, 2014

(51) Int. Cl.
    *H01J 37/32*    (2006.01)
(52) U.S. Cl.
    CPC ..... *H01J 37/32128* (2013.01); *H01J 37/32091* (2013.01)
(58) Field of Classification Search
    USPC .................................. 315/111.21–111.91, 11
    See application file for complete search history.

(56) References Cited

U.S. PATENT DOCUMENTS

| 5,845,480 | A  | * | 12/1998 | DeFreitas | ............... F02C 7/264 123/536 |
| 6,228,438 | B1 | * | 5/2001  | Schmitt   | ............... C23C 16/4583 118/723 E |
| 6,358,361 | B1 | * | 3/2002  | Matsumoto | ........... C23C 16/511 118/723 MW |
| 8,773,225 | B1 | * | 7/2014  | Vahidpour | ............... 315/111.21 |
| 2002/0148959 | A1 | * | 10/2002 | Weiss | .................. F24F 11/0012 250/288 |
| 2004/0182834 | A1 | * | 9/2004  | Kamarehi | ......... H01J 37/32192 219/121.43 |
| 2006/0192504 | A1 | * | 8/2006  | Ardavan | .................. G21K 1/16 315/503 |
| 2008/0060579 | A1 | * | 3/2008  | Hsieh | ................ H01J 37/32009 118/715 |
| 2008/0136332 | A1 | * | 6/2008  | Morfill | .............. H01J 37/32036 315/111.21 |

(Continued)

OTHER PUBLICATIONS

H Schmidth Characterization of a High Density Large area VHF plasma Source 2006 Ph D thesis.*

(Continued)

*Primary Examiner* — Douglas W Owens
*Assistant Examiner* — Srinivas Sathiraju
(74) *Attorney, Agent, or Firm* — WPAT, PC; Justin King

(57) ABSTRACT

A large-area plasma generating apparatus is disclosed, which includes a reaction chamber; a first electrode disposed in the reaction chamber; a second electrode parallel with the first electrode and disposed in the reaction chamber; and a discharge region formed between the first and second electrodes and a plasma can be formed therein; wherein a travelling wave or a traveling-wave-like electromagnetic field is generated via at least one of the first and second electrodes and travels from one end of the discharge region to its opposite end, so as to uniform the plasma in the discharge region.

10 Claims, 9 Drawing Sheets

(56) References Cited

U.S. PATENT DOCUMENTS

| | | | | |
|---|---|---|---|---|
| 2010/0218896 A1* | 9/2010 | Ai | ........................ | C23C 16/452 156/345.43 |
| 2010/0225234 A1* | 9/2010 | Tseng | ............... | H01J 37/32596 315/111.21 |
| 2010/0239757 A1* | 9/2010 | Murata | .................. | C23C 16/24 427/255.28 |
| 2011/0192348 A1* | 8/2011 | Tseng | .................. | C23C 16/509 118/723 E |
| 2012/0001549 A1* | 1/2012 | Ellingboe | ......... | H01J 37/32009 315/111.21 |
| 2012/0255492 A1* | 10/2012 | Wu | ..................... | C23C 16/0245 118/723 E |

OTHER PUBLICATIONS

Hannes Schmidt "Characterization of a high density, large-area VHF plasma source" 2006 Ph D thesis.*

H. Schmidth Characterization of a high density large area VHF plasma source 2006 Ph D thesis.*

David K. Cheng, Field and Wave Electromagnetics, Second Edition, Syracuse University, p. 403, Addison-Wesley Publishing Company, 1983.

David M. Pozar, Microwave Engineering, Second Edition, University of Massachusetts at Amherst, p. 71, John Wiley & Sons, Inc., 1998.

H. Mashima et al., "Large area VHF plasma production using a ladder-shaped electrode," Thin Solid Films, 506-507 (2006), 512-516, Elsevier, 2006.

David K. Cheng, Field and Wave Electromagnetics, Second Edition, Syracuse University, Addison-Wesley Publishing Company, 1983.

William H. Hayt, Jr. et al., Engineering Electromagnetics, Sixth Edition, p. 367, McGraw-Hill Higher Education, 2001.

B. Rech et. al., Microcrystalline silicon for large area thin film solar cells, Thin Solid Films 427 (2003) 157-165, Institute of Photovoltaics, Elsevier, 2003.

* cited by examiner

LARGE-AREA PLASMA GENERATING APPARATUS

TECHNICAL FIELD

The present disclosure relates to the field of large-area plasma generation, and more particularly, to a plasma generating apparatus in which multiple standing waves with specific patterns are launched simultaneously so that their superposition would result in a traveling wave or a traveling-wave-like electromagnetic field. Accordingly, the uniformity of plasma discharge can be effectively improved.

TECHNICAL BACKGROUND

Large-area plasma enhanced chemical vapor deposition (PECVD) has been considered as one of the most important apparatus to make the energy costs of thin film silicon solar cells competitive with grid electricity in that it can effectively improve the production throughput and hence reduce the production costs because of the characteristics of larger substrate and higher deposition rate. However, the non-uniform discharge caused by the standing wave effect imposes limitation on achieving uniform thin film deposition in large-area PECVD. Up to date, several attempts have been proposed to resolve the technological bottleneck, including lens-shaped electrode, ladder-shaped electrode or dual comb-type electrodes with phase modulation, superposition of two standing waves that are alternatively ignited and multiple feeding points. Although all the above-mentioned means could more or less improve the uniformity of plasma discharge, most of them might be limited to a fixed frequency and a specific operation window because they are based on the design concept that the configuration of special shaped electrode or the number and arrangement of feeding points is designed for a given standing wave pattern. Nevertheless, for radio-frequency (RF) and very-high-frequency (VHF) plasmas, the standing wave pattern depends on the wavelength of electromagnetic wave in the plasma region, which could be influenced by a variety of experimental parameters, such as frequency, discharge gap, power, pressure, and gas compositions. The actual wavelength in plasma ranges from 12% to 60% of that in vacuum.

Consequently, it is in need to develop a new plasma generating apparatus which is capable of providing large-area uniform plasma in its discharge region.

TECHNICAL SUMMARY

According to one aspect of the present disclosure, one embodiment provides a plasma generating apparatus including: a reaction chamber; a first electrode disposed in the reaction chamber; a second electrode parallel with the first electrode and disposed in the reaction chamber; and a discharge region formed between the first and second electrodes and a plasma can be formed therein; wherein a travelling wave or a traveling-wave-like electromagnetic field is generated by launching multiple standing waves with specific patterns at the same time via at least one of the first and second electrodes and travels from one end of the discharge region to its opposite end, so as to uniform the plasma in the discharge region.

In the embodiments, the plasma generating apparatus may further include a first feeding point on one end of the first electrode and a second feeding point on its opposite end; and a third feeding point on one end of the second electrode and a fourth feeding point on its opposite end; wherein two electromagnetic waves with a first phase difference are respectively launched into the first and second feeding points, so as to form a first standing wave in the discharge region; and wherein two electromagnetic waves with a second phase difference are respectively launched into the third and fourth feeding points, so as to form a second standing wave in the discharge region.

In the embodiments, the plasma generating apparatus may further include a first feeding point on one end of the first electrode, a second feeding point on its opposite end, and a third feeding point on its middle; wherein two electromagnetic waves with a phase difference of 180° are respectively launched into the first and second feeding points to form a first standing wave in the discharge region; and the second electrode is electrically grounded and another electromagnetic wave is launched into the third feeding point to form a second standing wave in the discharge region.

In the embodiments, the first standing wave may have an amplitude similar to that of the second standing wave, and the first and second standing waves are temporally out of phase by a range between 70° and 110° and spatially out of phase by a range between −70° and −110°, or the first and second standing waves are temporally out of phase by a range between −70° and −110° and spatially out of phase by a range between 70° and 110°.

In the embodiments, the first and second standing waves may have the same amplitude, and they are either temporally out of phase by 90° and spatially out of phase by −90°, or temporally out of phase by −90° and spatially out of phase by 90°.

In the embodiments, all the input electromagnetic waves launched into at least one of the first and second electrodes have a frequency in the HF, VHF, or UHF bands.

In the embodiments, the reaction chamber may be electrically grounded.

In the embodiments, each of the first and second electrodes may be shaped in a rectangle and the discharge region may have a thickness between the first and second electrodes ranging from 0.1 to 10 cm.

In the embodiments, the rectangle may have a length ranging from 10 to 300 cm and a width ranging from 1 to 60 cm.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Figure 1A:
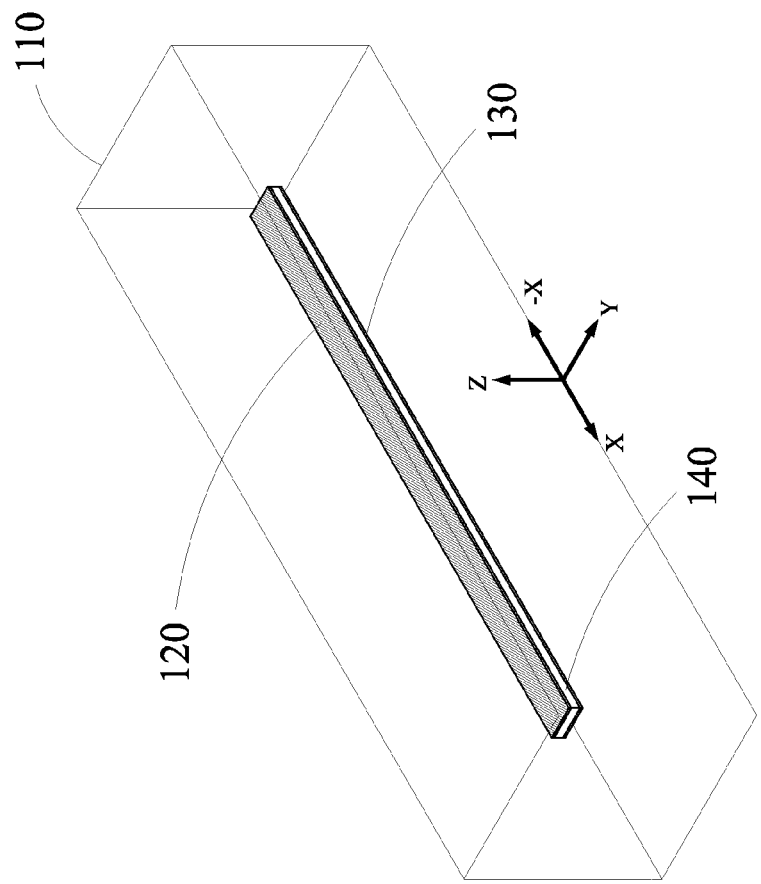
FIG. 1A shows perspective diagram of a plasma generating apparatus according to an embodiment of the present disclosure.
Figure 1B:
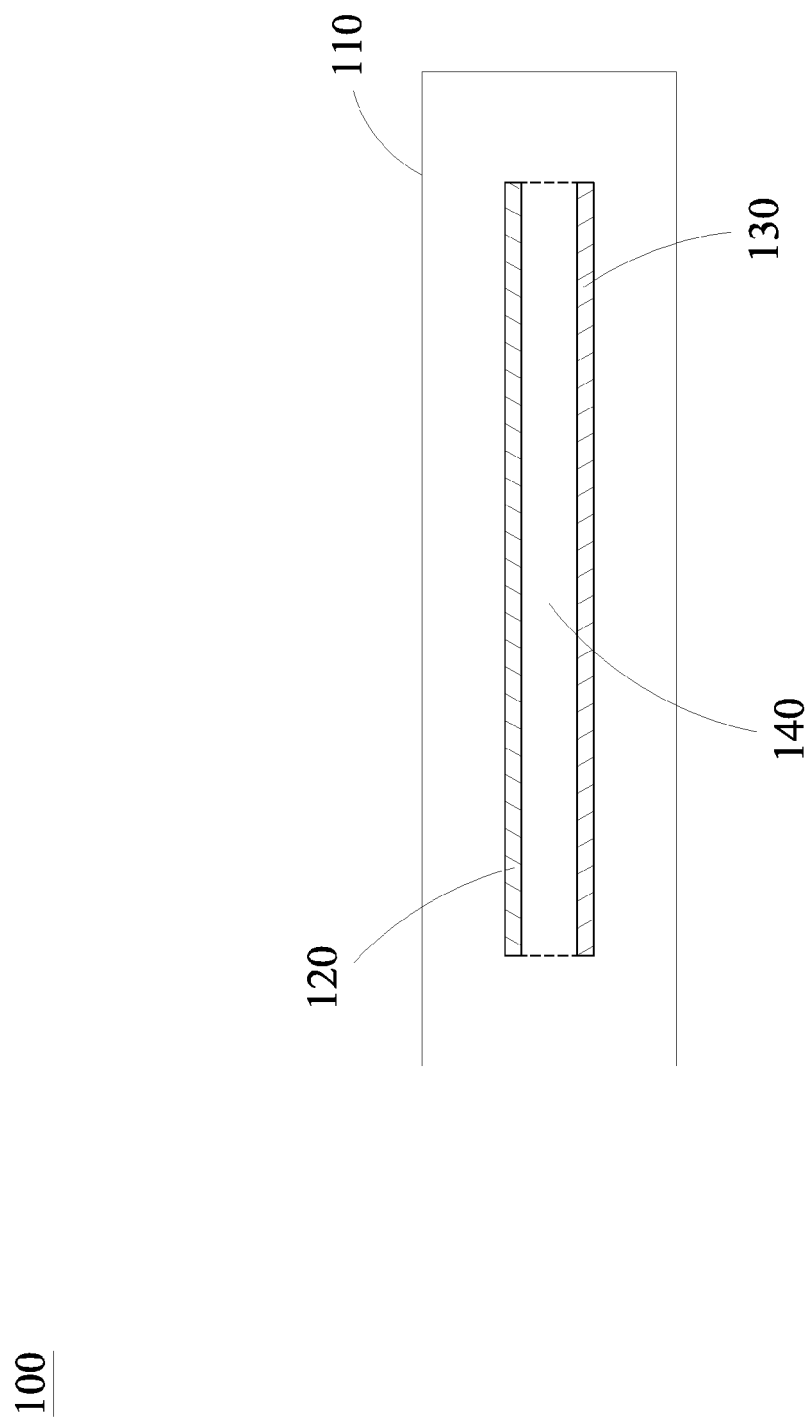
FIG. 1B is its cross-sectional view along the X direction.

FIG. 1A shows perspective diagram of a plasma generating apparatus 100 according to an embodiment of the present disclosure, and FIG. 1B is its cross-sectional view along the X direction. The plasma generating apparatus 100 includes a reaction chamber 110, a first electrode 120, a second electrode 130, and a discharge region 140 which is a space defined by the first electrode 120 and the second electrode 130. The reaction chamber 110 may be made of metal or metal alloy, as the one used in the CCP (capacitively coupled plasma) reactors. As shown in FIGS. 1A and 1B, the first electrode 120 and the second electrode 130 are parallel to each other in the reaction chamber 110, so that plasma can be formed in the discharge region 140. The first electrode 120 and the second electrode 130 may have feeding points to be fed with electromagnetic waves, so that a travelling wave or a traveling-wave-like electromagnetic field can be generated between the electrodes 120 and 130 and travels from one end of the discharge region 140 to its opposite end, so as to uniform the plasma in the discharge region 140.

The first electrode 120 and the second electrode 130 are disposed closely to each other in the reaction chamber 110 to form the plasma in the discharge region 140. The gap between the first and second electrodes 120 and 130 may range from 0.1 to 10 cm, to define the discharge region's 140 thickness properly. In an exemplary embodiment, the discharge region 140 may have a thickness of about 2 cm. Moreover, the first electrode 120 and the second electrode 130 may have a shape of the same size. As shown in FIG. 1A, each of the electrodes 120 and 130 may be shaped in a rectangle with its length ranging from 10 to 300 cm and its width ranging from 1 to 60 cm, according to the discharge region's 140 size and shape that the electrodes 120 and 130 are to be formed. For example, each of the first electrode 120 and the second electrode 130 can be a rectangle with a length of 150 cm and a width of 10 cm in the current embodiment. It should be understood that this disclosure is not limited thereto; the electrodes 120 and 130 may be shaped in a square or other suitable shape, according the design of the discharge region 140 to be formed.

Figure 2A:
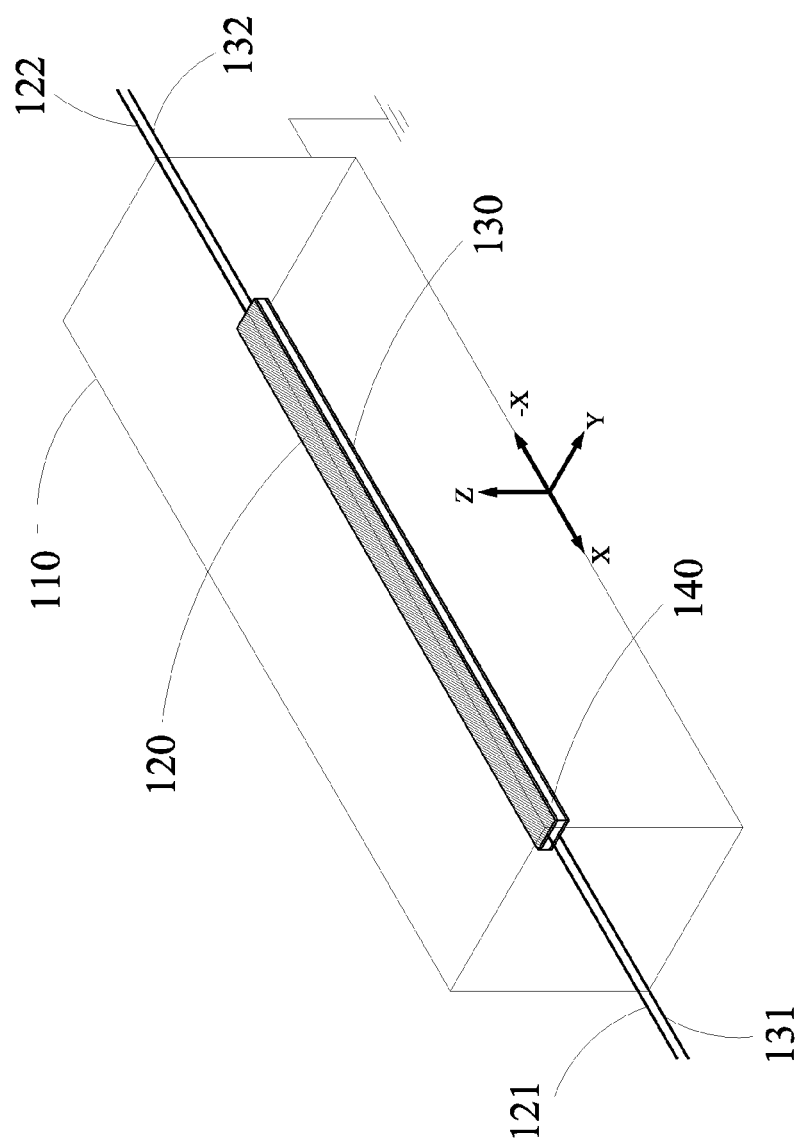
FIG. 2A shows perspective diagram of a plasma generating apparatus according to a first exemplary embodiment of the present disclosure.
Figure 2B:
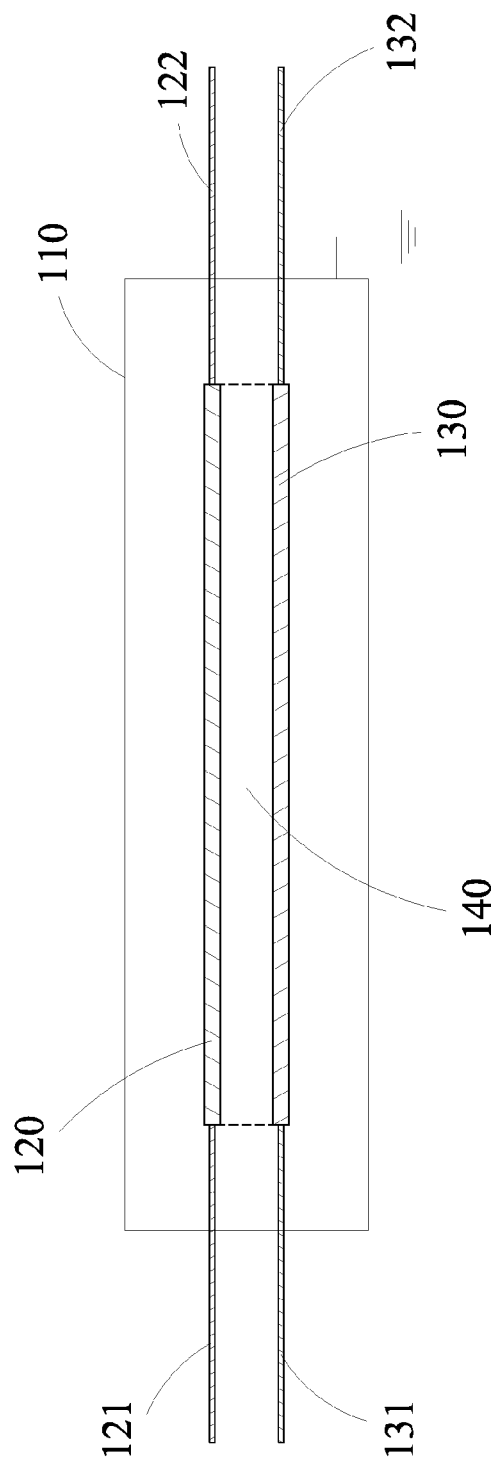
FIG. 2B is its cross-sectional view along the X direction.

In order to generate large-area uniform plasma in the discharge region 140, a travelling wave or a traveling-wave-like electromagnetic field can be generated in the discharge region 140 by simultaneously launching multiple standing waves in this disclosure. FIG. 2A shows perspective diagram of a plasma generating apparatus 200 according to a first exemplary embodiment of the present disclosure, and FIG. 2B is its cross-sectional view along the X direction. In this exemplary embodiment, the first electrode 120 may have a first feeding point 121 on the left-hand end of the first electrode 120 and a second feeding point 122 on its right-hand end, and the second electrode 130 may have a third feeding point 131 on the left-hand end of the second electrode 130 and a fourth feeding point 132 on its right-hand end. Wherein, two electromagnetic waves with a first phase difference are respectively fed into the first and second feeding points 121 and 122, so that a first standing wave can be formed in the discharge region 140; and another two electromagnetic waves with a second phase difference which is different from the first phase difference by 180° are respectively fed into the third and fourth feeding points 131 and 132, so as to a second standing wave can be formed in the discharge region 140. In other words, the two electromagnetic waves respectively fed into the first and second feeding points 121 and 122 may be of the same amplitude and frequency, but they may have a phase difference $\psi_1$ from each other. Also, the two electromagnetic waves respectively fed into the third and fourth feeding points 131 and 132 may be of the same amplitude and frequency, but they may have a phase difference $\psi_2$ from each other, and the difference between the phase differences $\psi_1$ and $\psi_2$ is 180°. For example, if the phase difference iii is 180°, the phase difference $\psi_2$ can be 0°; or if the phase difference $\psi_1$ is 200°, the phase difference $\psi_2$ can be 20°.

In the embodiments, the reaction chamber may be electrically grounded. For the sake of simplicity, the above-mentioned electromagnetic waves are considered to be of sinusoidal waveform propagating in the rectangular coordinate. Thus, the first and second standing waves can be expressed by sinusoidal functions as the following mathematical formulas:

$$SW1 = A \times \cos(\omega t) \times \cos(-kx)$$

and $$SW2 = A \times \cos(\omega t \pm 90°) \times \cos(-kx \mp 90°).$$

Wherein the first and second standing waves are denoted as SW1 and SW2, respectively, A denotes the amplitude of the first and second standing waves SW1 and SW2, w denotes the angular frequency, t denotes the time, k denotes the phase constant of the electromagnetic waves, and x denotes the distance along the direction of wave propagation.

If the first and second standing waves are applied to the discharge region 140 concurrently, their superposition may result in A×cos(ωt−kx) or A×cos(ωt+kx), both of which are traveling waves. As a consequence, a traveling wave can be generated in the discharge region 140, by means of superposing two standing waves that have the same amplitude and are either temporally out of phase by 90° and spatially out of phase by −90°, or temporally out of phase by −90° and spatially out of phase by 90°. In the embodiments, all the electromagnetic waves fed into the feeding points 121, 122, 131 and 132 may have a frequency in the high frequency (denoted as HF, radio frequency from 3 MHz to 30 MHz), very high frequency (denoted as VHF, radio frequency from 30 MHz to 300 MHz), or ultra high frequency (denoted as UHF, radio frequency from 300 MHz to 3000 MHz) bands. A uniform discharge can be obtained in the discharge region 140 due to the characteristics of traveling waves.

To verify the feasibility of realizing the traveling wave, the electric field distribution can be calculated in the simulation domain shown in FIGS. 2A and 2B. The first electrode 120 and the second electrode 130 are parallel to each other in the reaction chamber 110. The gap between the first and second electrodes 120 and 130 is 2 cm, which is also the thickness of the discharge region 140 defined by the first and second electrodes 120 and 130. Each of the electrodes 120 and 130 is shaped in a bar-like rectangle with a length of 150 cm and a width of 10 cm. Such an electrode pattern is employed to avoid a significant standing wave effect along the much shorter dimension.

Figure 4A:
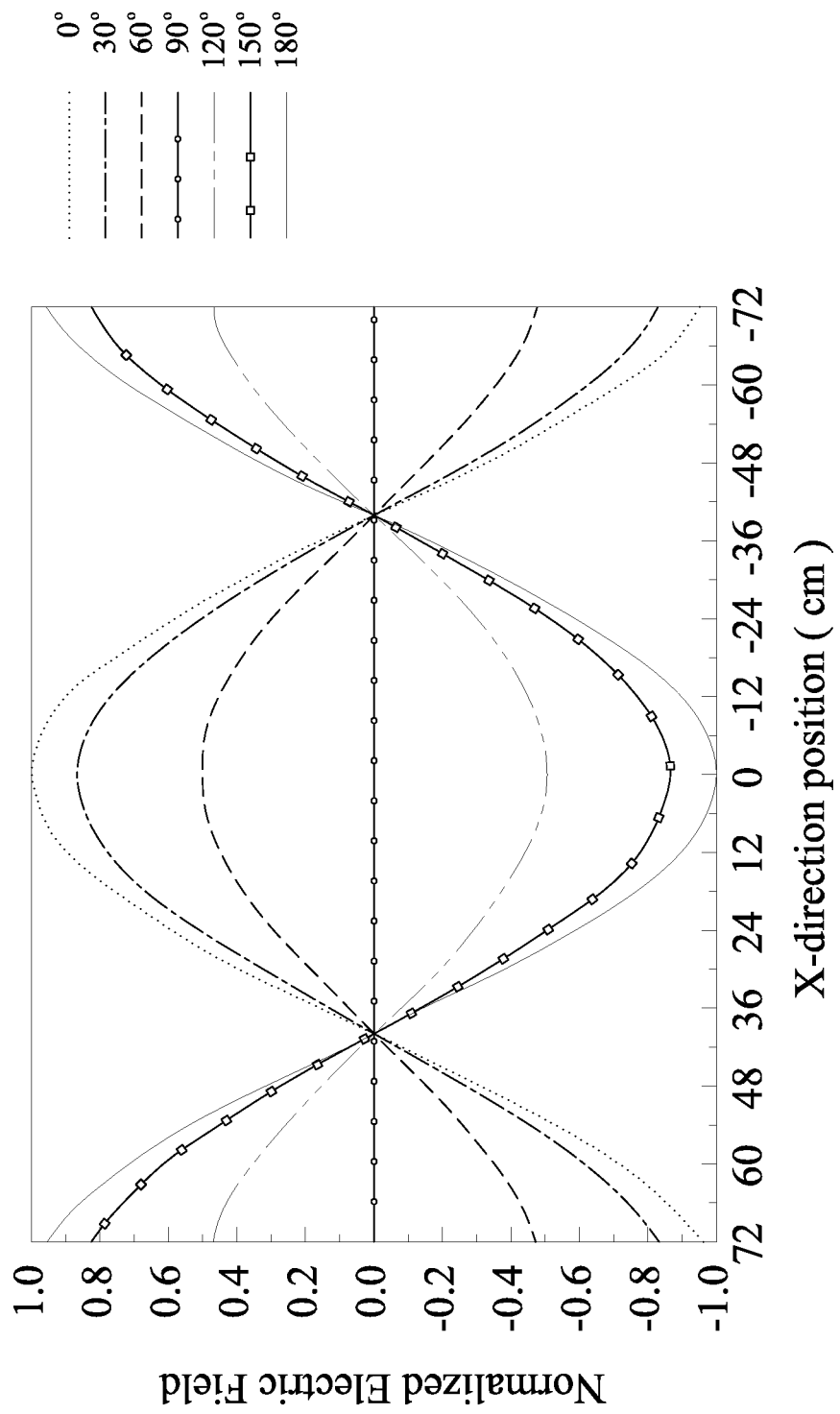
FIG. 4A shows the electric field distributions in the discharge region along the centerline of the longer dimension obtained with the first standing wave at different phase angles as marked on the curves.
Figure 4B:
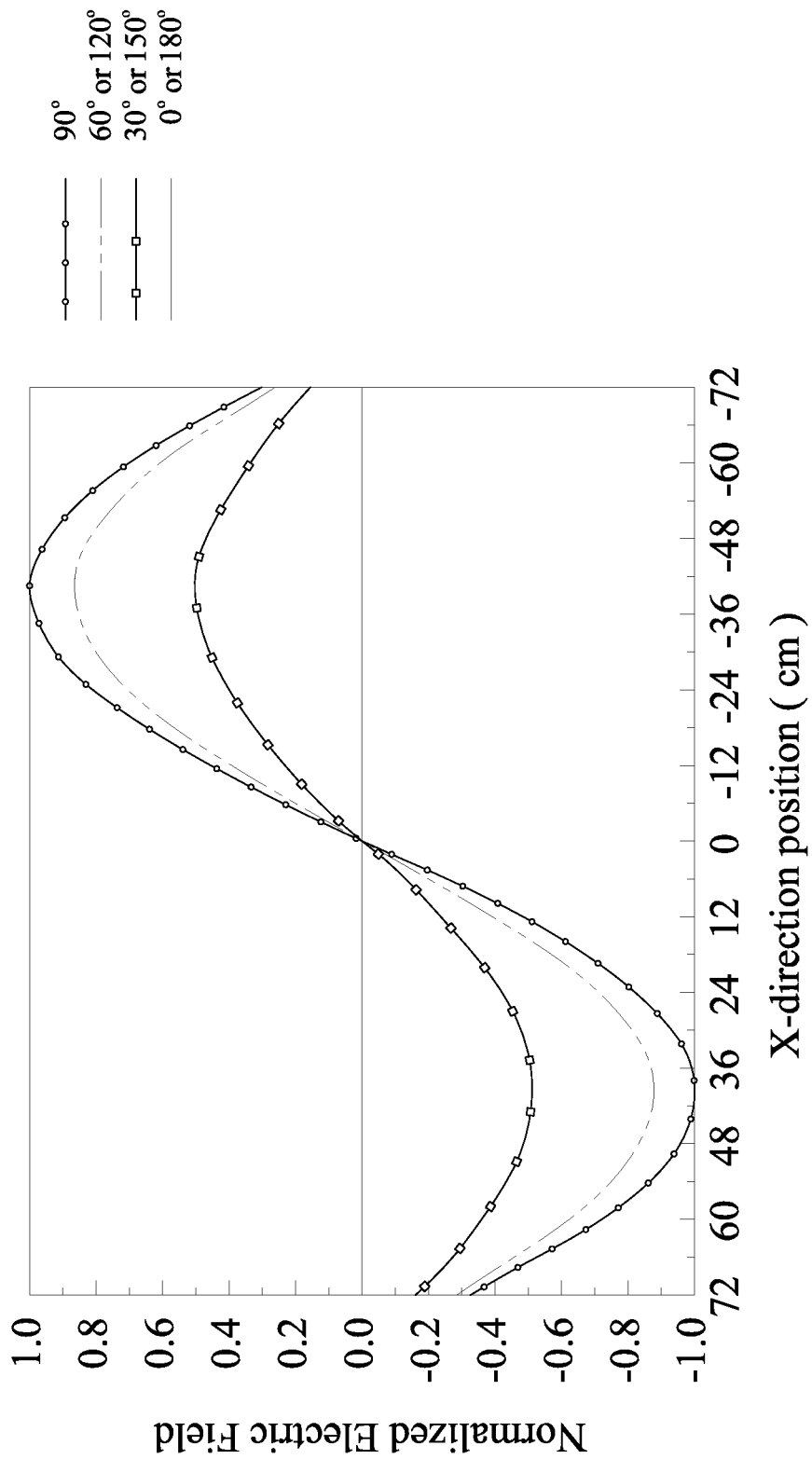
FIG. 4B shows the electric field distributions in the discharge region along the centerline of the longer dimension obtained with the second standing wave at different phase angles as marked on the curves.

Two electromagnetic waves of the same amplitude and frequency with a phase difference $\psi_1=0°$ are fed into the first and second feeding points 121 and 122, respectively, to form the first standing wave. The frequency is 100 MHz in the current example. The wavelength of the electromagnetic wave in the discharge region is assumed to be 1.6 m. FIG. 4A shows the electric field distributions in the discharge region along the centerline of the longer dimension obtained with the first standing wave at different phase angles as marked on the curves. There is an antinode at the center for the standing wave as shown in FIG. 4A. The standing wave pattern may shift leftwards if the phase difference $\psi_1>0°$ and rightwards if the phase difference $\psi_1<0°$. Here $\psi_1>0°$ means that the phase angle at the feeding point 122 is leading with respect to the feeding point 121, while $\phi<0°$ means that the phase angle at the feeding point 122 is lagging with respect to the feeding point 121. Also, another two electromagnetic waves of the same amplitude and frequency with a phase difference $\psi_2=180°$ are fed into the third and fourth feeding points 131 and 132, respectively, to form the second standing wave. FIG. 4B shows the electric field distributions in the discharge region along the centerline of the longer dimension obtained with the second standing wave at different phase angles as marked on the curves. There is a node at the center for the standing wave as shown in FIG. 4B. According to FIGS. 4A and 4B, it can be observed that these two standing waves are 90° out of phase in space and time. That is, either an antinode or a node is located at the center of each electrode 120/130. Moreover, if the electric field of one of the standing waves reaches its absolute maximum, the other would be flat along the X direction.

Figure 4C:
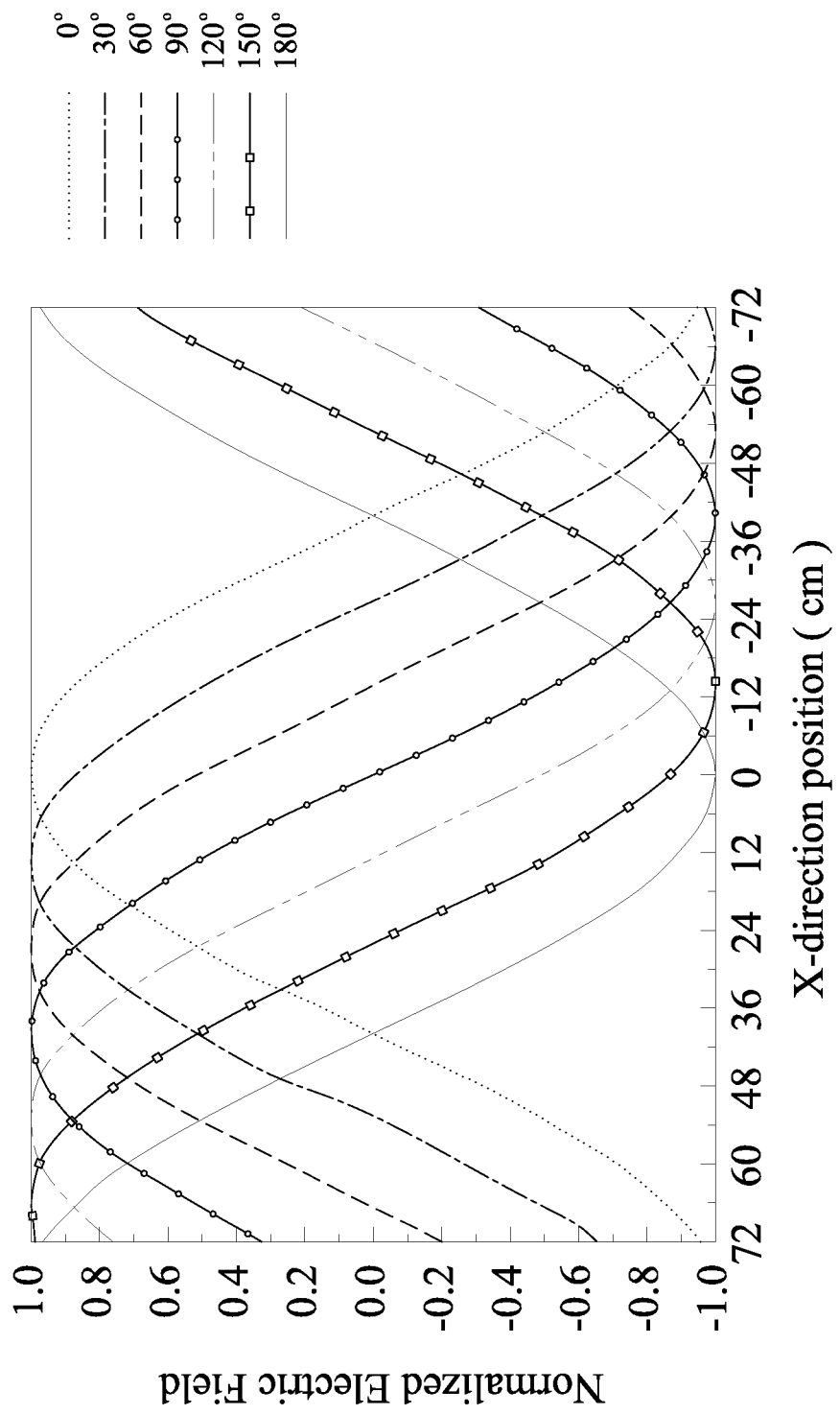
FIG. 4C shows the electric field distributions in the discharge region along the centerline of the longer dimension at different phase angles as marked on the curves, when a traveling wave is formed by the superposition of the first and second standing waves.

When the first standing wave, as shown in FIG. 4A, and the second standing wave, as shown in FIG. 4B, are applied simultaneously to the discharge region 140 between the first and second electrodes 120 and 130, the resulting electric field distribution can be plotted in FIG. 4C. The main features in FIG. 4C are that the electric field's absolute maximums may shift its positions as the time passes and that the absolute maximums do not change with time. These features indicate that the superposition of the two standing waves can form a pure traveling wave, which may propagate in the discharge region 140 from one end to the other. Once the traveling wave is produced in the plasma, all the locations would experience a complete wave cycle during its propagation. As a result, a uniform plasma discharge can be expected in the discharge region 140.

In the above-described exemplary embodiment, to form a pure traveling wave, the input voltage and the initial phase angle for each feeding point must be carefully adjusted to ensure that both standing waves have the same amplitude and they are either temporally out of phase by 90° and spatially out of phase by −90°, or temporally out of phase by −90° and spatially out of phase by 90°. In some cases, however, it is not easy to generate a pure traveling wave in the discharge region 140, or it may be effective enough to have an electromagnetic pattern close to a pure travelling wave to uniform the plasma in the discharge region 140, to a certain extent. For example, if the standing waves have slightly different amplitudes, their superposition would be dominated by the standing wave with larger amplitude. That is, the locations with absolute maximum electric field (or electric voltage) are determined by the larger standing wave. However, due to the slight difference in the amplitudes of the two standing waves, the superposition will still be quite similar to a pure traveling wave, i.e., a traveling-wave-like electromagnetic field or an electromagnetic field with a traveling-wave base. For some applications, such as thin film silicon solar cell, the requirement for the non-uniformity of thin film deposition is below 10%. A traveling-wave-like electromagnetic wave may be sufficient to fulfill the requirement. Furthermore, we may fail to meet the requirement for temporal and spatial phase differences of 90° or we do not need a pure traveling wave in the discharge region 140 for some considerations. For such cases, the first standing wave may have an amplitude similar to that of the second standing wave, and the first and second standing waves are temporally out of phase by a range between 70° and 110° and spatially out of phase by a range between −70° and −110°, or they are temporally out of phase by a range between −70° and −110° and spatially out of phase by a range between 70° and 110°. Thus, a major part of the first and second standing waves are converted into a traveling wave in the discharge region 140, and the remainder part are still standing waves in the discharge region 140. The combination of the traveling wave and the standing waves can be used to uniform, to a certain extent, the plasma in the discharge region 140.

Figure 3A:
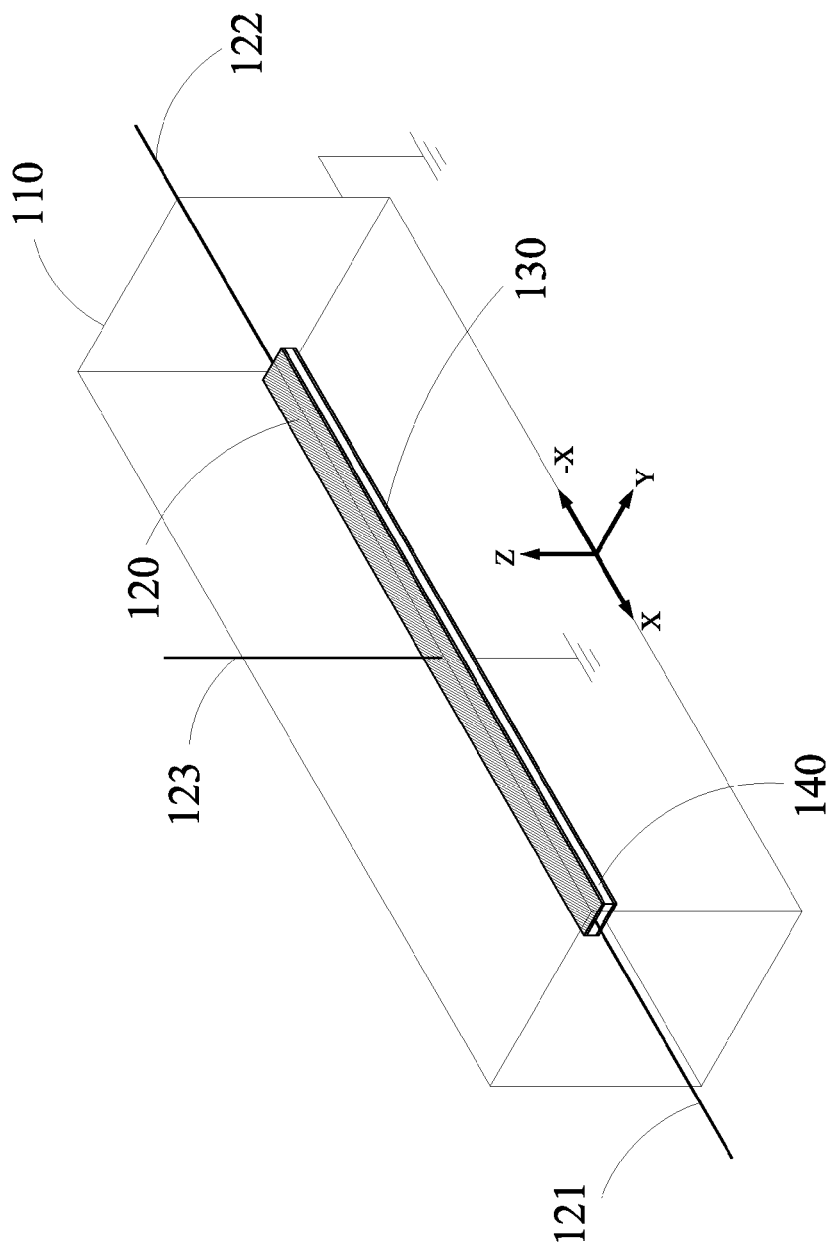
FIG. 3A shows perspective diagram of a plasma generating apparatus according to a second exemplary embodiment of the present disclosure.
Figure 3B:
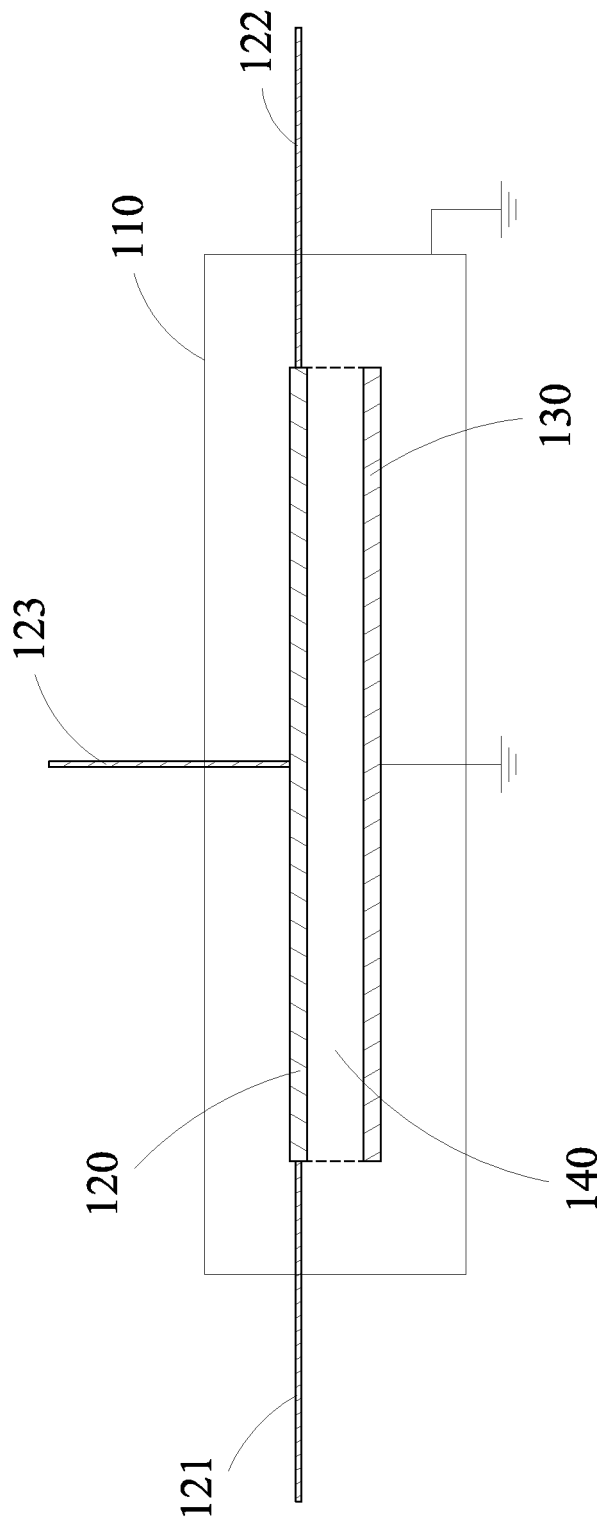
FIG. 3B is its cross-sectional view along the X direction.

FIG. 3A shows perspective diagram of a plasma generating apparatus 300 according to a second exemplary embodiment of the present disclosure, and FIG. 3B is its cross-sectional view along the X direction. In this exemplary embodiment, the second electrode 130 is electrically grounded while the first electrode 120 has a first feeding point 121 on the left-hand end of the first electrode 120, a second feeding point 122 on its right-hand end, and a third feeding point 123 at its middle. Wherein, two electromagnetic waves with a phase difference of 180° are respectively fed into the first and second feeding points 121 and 122, so that a first standing wave can be formed in the discharge region 140. Also, another electromagnetic wave is fed into the third feeding point 123 to form a second standing wave in the discharge region 140. In some embodiments, the first standing wave may have an amplitude similar to that of the second standing wave, and the first and second standing waves are temporally out of phase by a range between 70° and 110° and spatially out of phase by a range between −70° and −110°, or they are temporally out of phase by a range between −70° and −110° and spatially out of phase by a range between 70° and 110°. Thus, a major part of the first and second standing waves are converted into a traveling wave in the discharge region 140, and the remainder part are still standing waves in the discharge region 140. The combination of the traveling wave and the standing waves can be used to uniform, to a certain extent, the plasma in the discharge region 140. For example, if the standing waves have slightly different amplitudes, their superposition would be dominated by the standing wave with larger amplitude. That is, the locations with maximum electric field (or electric voltage) are determined by the larger standing wave. However, due to the slight difference in the amplitudes of the two standing waves, the superposition will still be quite similar to a pure traveling wave, i.e., a traveling-wave-like electromagnetic field or an electromagnetic field with a traveling-wave base.

In a preferable embodiment, the first and second standing waves may have the same amplitude and are temporally and spatially out of phase by 90°, which are superposed to form a traveling wave in the discharge region 140. The temporal and spatial phase differences have different signs. Once the traveling wave is produced in the plasma region, all the locations therein would experience a complete wave cycle during its propagation, as the traveling wave scans the discharge region 140 from one end to the other. Hence, a uniform plasma discharge can be expected in the discharge region 140. In the embodiments, all the input electromagnetic waves launched into at least one of the first and second electrodes may have a frequency in the HF, VHF, or UHF bands.

As described in the above disclosure, a plasma generating apparatus has been presented to generate uniform plasma with large area electrodes. Compared to most of the existing techniques, the current apparatus is more advantageous because of the following reasons. First, it has the potentials to be applicable to various frequencies and a wider operation window because it is not designed to match up with a specific standing wave pattern. Even if the actual wavelength in plasma depends on varieties of parameters, the variation in wavelength would only lead to change in the number of wave cycles appearing on the electrodes at a given moment. However, the characteristics of traveling wave could still produce uniform discharge as long as the effect of wave decay is not significant. Secondly, the typical requirement of deposition non-uniformity for thin film silicon solar cell is <10%, which is determined by the ratio of the difference between maximum and minimum thickness to the summation of maximum and minimum values. If the thin film deposition rate is linearly proportional to electric field (or voltage), it suggests that the requirement can still be fulfilled even if the traveling wave decays by around 20%. In other words, the current apparatus in this disclosure possesses a tolerance for slight wave attenuation.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A plasma generating apparatus comprising:
a reaction chamber;
a first electrode disposed in the reaction chamber;
a second electrode parallel with the first electrode and disposed in the reaction chamber;
a discharge region formed between the first and second electrodes and a plasma can be formed therein; and
an at least one feeding point on at least one of the first and second electrodes, allowing of introducing electromagnetic waves to the at least one feeding point to form a first and a second standing waves with different spatial and temporal patterns in the discharge region at the same time, and of superposing the first and second standing waves to generate a travelling wave or a traveling-wave-like electromagnetic field moving from one end of the discharge region to its opposite end;
wherein the first standing wave has an amplitude similar to that of the second standing wave, and the first and second standing waves are either temporally out of phase by a range between 70° and 110° and spatially out of phase by a range between −70° and −110°, or temporally out of phase by a range between −70° and −110° and spatially out of phase by a range between 70° and 110°.

2. The plasma generating apparatus according to claim 1, wherein the at least one feeding point comprises a first feeding point on one end of the first electrode and a second feeding point on its opposite end, and a third feeding point on one end of the second electrode and a fourth feeding point on its opposite end, allowing of respectively introducing two electromagnetic waves with a first phase difference to the first and second feeding points to form the first standing wave in the discharge region, and of respectively introducing another two electromagnetic waves with a second phase difference to the third and fourth feeding points to form the second standing wave in the discharge region.

3. The plasma generating apparatus according to claim 1, wherein the first and second standing waves have the same amplitude, and are either temporally out of phase by −90° and spatially out of phase by 90°, or temporally out of phase by 90° and spatially out of phase by −90°.

4. The plasma generating apparatus according to claim 1, wherein each of the electromagnetic waves has a frequency in the HF, VHF, or UHF bands.

5. The plasma generating apparatus according to claim 1, wherein the second electrode is electrically grounded, and the at least one feeding point comprises a first feeding point on one end of the first electrode, a second feeding point on its opposite end, and a third feeding point on its middle, allowing of respectively introducing two electromagnetic waves with a phase difference of 180° to the first and second feeding points to form the first standing wave in the discharge region, and of introducing another electromagnetic wave to the third feeding point to form the second standing wave in the discharge region.

6. The plasma generating apparatus according to claim 5, wherein the first and second standing waves have the same amplitude, and are either temporally out of phase by −90° and spatially out of phase by 90°, or temporally out of phase by 90° and spatially out of phase by −90°.

7. The plasma generating apparatus according to claim 5, wherein each of the electromagnetic waves has a frequency in the HF, VHF, or UHF bands.

8. The plasma generating apparatus according to claim 1, wherein the reaction chamber is electrically grounded.

9. The plasma generating apparatus according to claim 1, wherein each of the first and second electrodes is shaped in a rectangle and the discharge region has a thickness between the first and second electrodes ranging from 0.1 to 10 cm.

10. The plasma generating apparatus according to claim 9, wherein the rectangle has a length ranging from 10 to 300 cm and a width ranging from 1 to 60 cm.

* * * * *